United States Patent [19]

Cappon

[11] 4,177,390
[45] Dec. 4, 1979

[54] A FIELD EFFECT TRANSISTOR LOGIC GATE HAVING DEPLETION MODE AND ENHANCEMENT MODE TRANSISTORS

[75] Inventor: Arthur M. Cappon, Boston, Mass.
[73] Assignee: Raytheon Company, Lexington, Mass.
[21] Appl. No.: 864,292
[22] Filed: Dec. 27, 1977
[51] Int. Cl.² .................... H03K 19/08; H03K 19/12; H03K 19/36; H03K 19/40
[52] U.S. Cl. ................... 307/205; 307/213; 307/215; 307/270; 307/304
[58] Field of Search ............ 307/205, 215, 251, 270, 307/304, 213, 214

[56] References Cited
U.S. PATENT DOCUMENTS

| 4,028,556 | 6/1977 | Cachier et al. | 307/205 |
| 4,101,788 | 7/1978 | Baker | 307/205 |

FOREIGN PATENT DOCUMENTS 2230125  12/1974  France ................... 307/205

OTHER PUBLICATIONS

Nuzillat et al., "Subnanosecond Integrated Switching Circuit with MESFET's for LSI", *IEEE-JSSC*, vol-sc-11, No. 3, pp. 385-394, 6/1976.
Hayashi et al., "Design of ED-MOS Buffer", *Electronics and Communications in Japan*, vol. 55-c, No. 10, pp. 107-114, 10/1972.
Tuyl et al., "High-Speed Integrated Logic with GaAs MESFET's", *IEEE-JSSC*, vol. sc-9, No. 5, pp. 269-276, 10/1974.
Cahen et al., "A Subnanosecond Switching Circuit", Feb. 14, 1974 *IEEE Int'l Solid-State Circuits Conf.*, pp. 110-111.

*Primary Examiner*—Larry N. Anagnos
*Attorney, Agent, or Firm*—Richard M. Sharkansky; Joseph D. Pannone

[57] ABSTRACT

A logic gate having a first depletion mode field effect transistor with a gate electrode adapted for coupling to a control signal source, a second depletion mode field effect transistor and an enhancement mode field effect transistor, such enhancement mode field effect transistor being serially connected to the second depletion mode transistor. The second depletion mode transistor and the enhancement field effect transistor are fed by the first depletion mode transistor. One of such serially connected transistors has a Schottky gate contact. With such arrangement the logic gate includes a "complementary" pair of relatively short channel length devices fed by a relatively short channel length device to provide low static power dissipation and large output capacitance drive capability.

11 Claims, 20 Drawing Figures

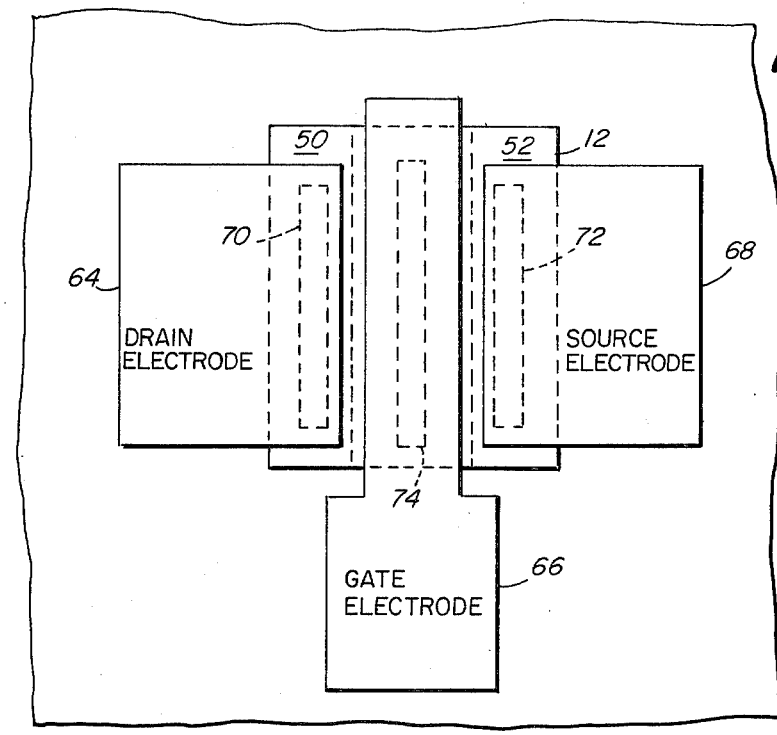
*FIG. 1j*
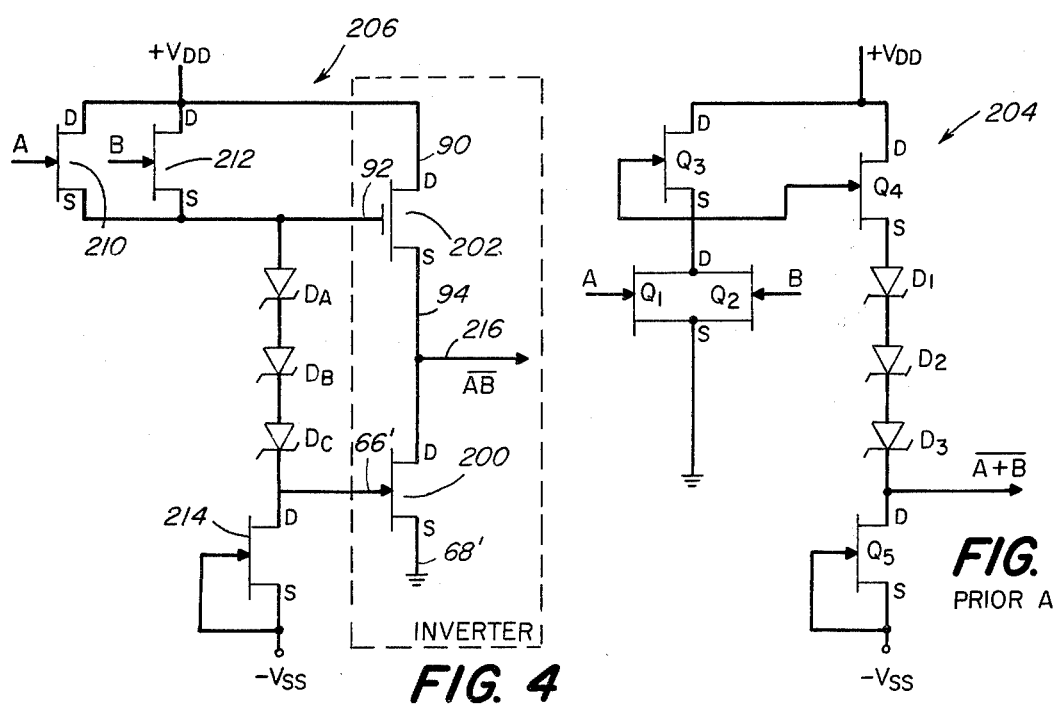
*FIG. 4*
*FIG. 3*
PRIOR ART

A FIELD EFFECT TRANSISTOR LOGIC GATE HAVING DEPLETION MODE AND ENHANCEMENT MODE TRANSISTORS

BACKGROUND OF THE INVENTION

This invention relates generally to logic gate circuits.

As is known in the art, high speed, digital logic circuits have been designed using gallium-arsenide (GaAs) Schottky-gate MESFET (metal electrode semiconductor field effect transistor) technology by combining the high mobility characteristics of GaAs and the short channel lengths of Schottky-gate depletion mode transistors. However, yields have been relatively low because, in order to achieve channel lengths in the order of a micron, complex photolithographic techniques are at their diffraction imposed limits, and, further, gallium arsenide material is relatively difficult material to prepare and cannot readily be subjected to temperatures required for solid state diffusion.

As is further known in the art, it is frequently desirable to form at the output portion of a logic gate an N channel and P channel effect transistor in order to form a "complementary" pair of interconnected transistors on a single crystal substrate which provides low static power dissipation and large output capacitance drive capability. Such complementary pair formation is not generally practical with a substrate of GaAs.

SUMMARY OF THE INVENTION

In accordance with the present invention a logic gate includes a first depletion mode field effect transistor having a gate electrode adapted for coupling to a control signal source, a second depletion mode field effect transistor and an enhancement mode field effect transistor, such enhancement mode transistor and second depletion mode transistor being serially connected and fed by the first depletion mode transistor, one of such serially connected transistors having a Schottky gate contact.

With such arrangement the logic gate includes a complementary pair of relatively short channel length devices fed by relatively short channel length devices to provide low static power dissipation and large output capacitance drive capability.

BRIEF DESCRIPTION OF THE DRAWINGS

The above-mentioned and other features of the invention will become more apparent by reference to the following description taken together in conjunction with the accompanying drawings, in which:

FIG. 1j is a plane view of the completed field effect device;

FIG. 3 is a schematic diagram of a logic gate according to the prior art; and

FIG. 4 is a schematic diagram of a logic gate using the pair of field effect devices manufactured in accordance with the steps described in connection with FIGS. 2a-2h.

DESCRIPTION OF THE PREFERRED EMBODIMENTS

Figure 1A:
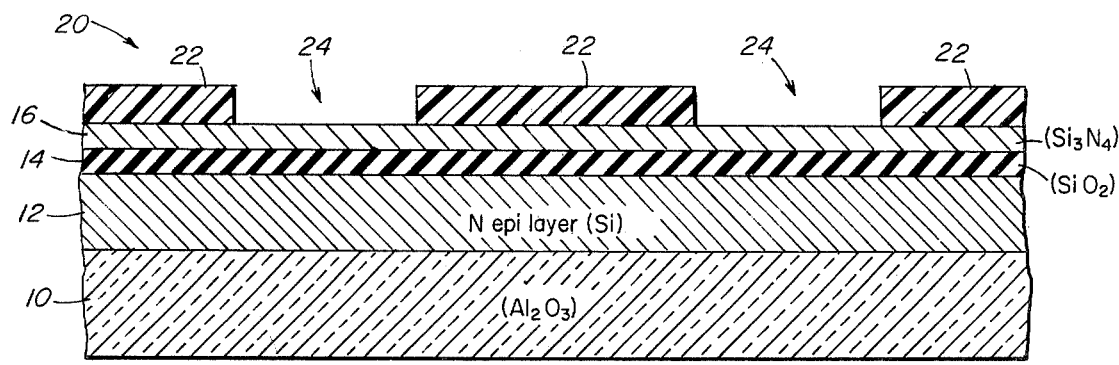
FIGS. 1a-1i are cross-sectional elevational views, somewhat distorted, of a field effect device at various steps in the manufacture thereof.

Referring now to FIGS. 1a-1j, the steps in forming an N channel depletion-mode Schottky Metal Electrode Semiconductor Field Effect Transistor (MESFET) are shown. As indicated in FIG. 1a, a sapphire ($Al_2O_3$) substrate 10 has an epitaxial semiconductor layer 12, here N type conductivity silicon, formed on the surface of such substrate 10. The epitaxial layer 12 is here formed on a plane parallel to a $<1\bar{1}02>$ crystallographic plane of the substrate 10 and the surface of the semiconductor layer 12 is parallel to a $<100>$ crystallographic plane of the semiconductor layer 12. The sapphire substrate 10 with the epitaxial layer 12 formed thereon as described is here manufactured by Union Carbide Corporation, San Diego, California. The epitaxial layer 12 has a thickness here in the order of 0.75 microns and an N type conductivity concentration in the order of $10^{14}$ atoms/$cm^3$. The surface of the epitaxial layer 12 is oxidized in a conventional manner to form an insulating layer 14 of silicon dioxide on such surface having a thickness of here 1000–2000 Å. Next, a layer 16 of silicon nitride ($Si_3N_4$) is formed, here chemically vapor deposited, on the surface of the insulating layer 14. Here the thickness of the silicon nitride layer 16 is in the order of 1000 Å. A mask 20 of photoresist 22 is formed on the surface of the silicon nitride layer 16 using conventional photolithography to form apertures 24 in such photoresist 22. The apertures 24 are formed in the mask 20 where isolation regions are to be formed about the field effect transistor.

Figure 1B:
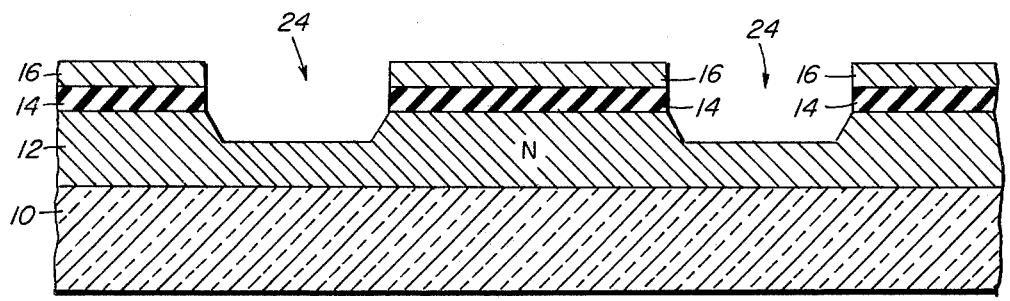

Referring now also to FIG. 1b, the portions of the silicon nitride layer 16 exposed by the apertures 24 are removed using R.F. (radio frequency) plasma etching techniques. The photoresist layer 22 is then removed in a conventional manner. The exposed portions of the insulating layer 14 are then removed, here chemically etched away, by bringing such exposed portions of the insulating layer 14 in contact with a suitable etchant, here a solution of hydrofluoric acid (HF). Next, the exposed portions of the epitaxial layer are brought in contact with an anisotropic etchant, here an ethylene diamine-pyrocatechol solution. Alternatively, other anisotropic etchants, such as a saturated solution of sodium hydroxide (NaOH) in water or potassium hydroxide (KOH), 1-Propanol and water, may be used. It is noted that the remaining portions of the insulating layer 14 and the silicon nitride layer 166 provide an etch resistant mask used in forming isolation regions about the transistor. The mask is oriented to enable etching of the epitaxial layer 12 along the $<110>$ crystallographic axis of such layer 12. The anisotropic etchant etches away the portions of the epitaxial layer 12 exposed by the mask with extremely little etching occurring to the epitaxial layer 12 which is underneath the mask. The anisotropic etchant produces isolation grooves in the epitaxial layer 12 which have truncated wedge-shaped cross-sections, as shown. The side walls of the grooves are parallel to the $<111>$ crystallographic plane of the epitaxial layer and make an acute angle, 54.7°, with respect to the surface of the epitaxial layer 12. The width of the grooves is here in the order of 2.5 μm to 5.0 μm. The etching process continues until the bottom walls of the grooves reach a depth in the order of 0.3–0.4 μm from the upper exposed surface of the epitaxial layer 12, as shown in FIG. 1b.

Figure 1C:
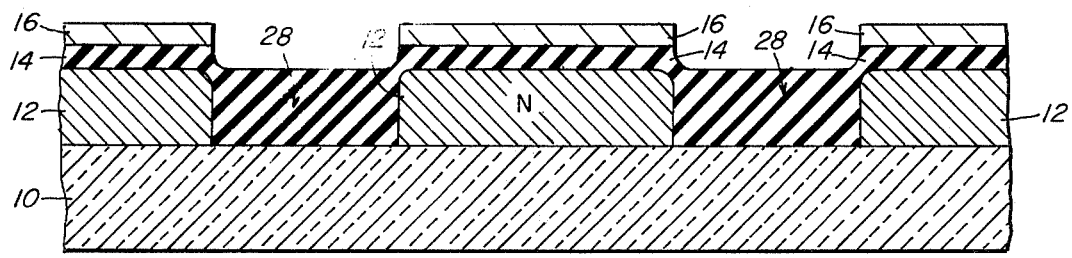

Referring now also to FIG. 1c, the structure thus formed is placed in an oxidizing environment to oxidize the side walls and bottom walls of the grooves producing silicon dioxide material 28 in such grooves, i.e., in the isolation regions between transistors. It is noted that during the oxidizing process the grooves "fill in" with silicon dioxide.

Figure 1D:
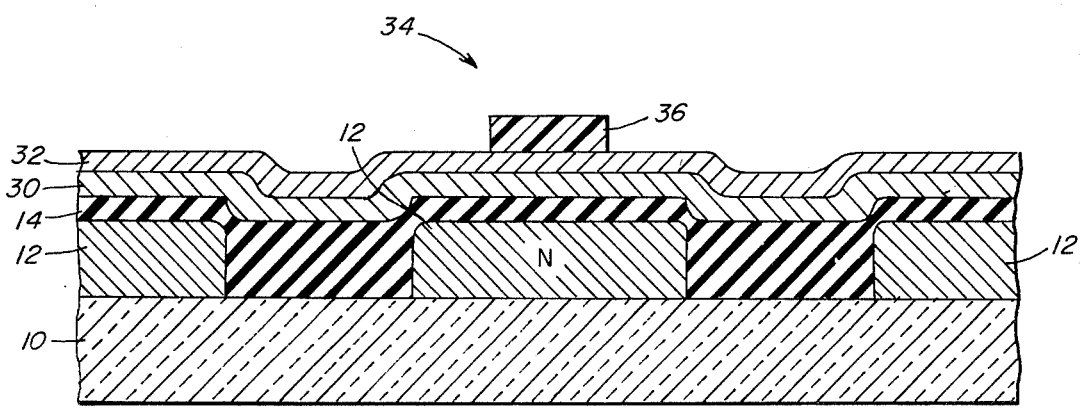

Referring now also to FIG. 1d, the silicon nitride layer 16 is removed, here by plasma etching in a conventional manner, and a layer 30 of polycrystalline silicon, here having a thickness of 3000 Å, is deposited over the surface of the structure as shown, here by chemical vapor deposition in a conventional manner. (It is noted that the polycrystalline silicon layer 30 will sometimes be referred to herein also as a masking layer 30 for reasons to become apparent). Next, a layer 32 of silicon nitride is deposited over the polycrystalline silicon layer 30, as shown, here using conventional chemical vapor deposition. Here such layer 32 has a thickness of 1000 Å. A mask 34 of photoresist material 36, here having a width of 5 μm, is formed over the relatively central portion of the transistor, as shown, using conventional photolithography.

Figure 1E:
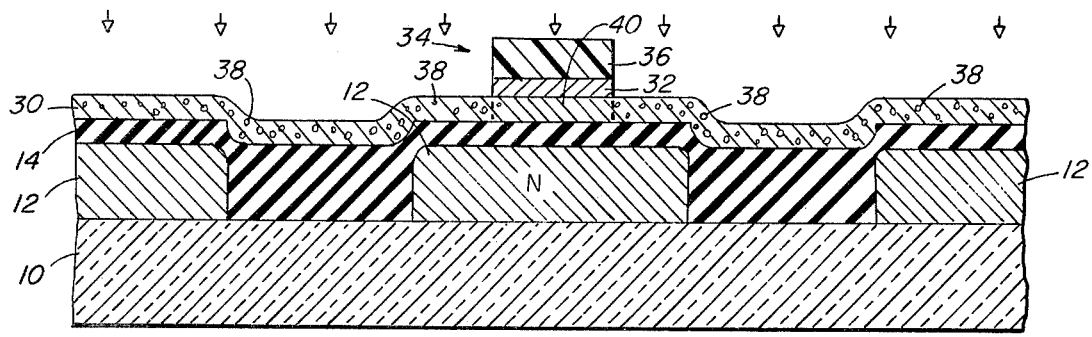

Referring now also to FIG. 1e, the portions of the silicon nitride layer 32 exposed by the photoresist mask 34 are brought in contact with a suitable etchant, here by plasma etching, to remove such exposed portions as shown. The surface of the structure is exposed to boron ions using suitable ion implanting apparatus, not shown. The ion implant is illustrated in FIG. 1e by the arrows, not numbered. The photoresist 36 and silicon nitride layer 32 serve as an ion implantation mask so that the boron ions become implanted into the polycrystalline silicon or masking layer 30 as shown. The energy level of the ion implanting apparatus is here in the order of 100 KeV and the dose is in the order of $3 \times 10^{15}$ atom/cm$^2$ so that the minimum carrier density of boron atoms 38 in the exposed portions of the masking layer 30 is greater than $7 \times 10^{19}$ atoms/cm$^3$. It is noted that two P type regions are thus formed, such regions being separated by the portion 40 of the polycrystalline silicon layer 30 disposed beneath the photoresist 36 and silicon nitride layer 32, as shown in FIG. 1e.

Figure 1F:
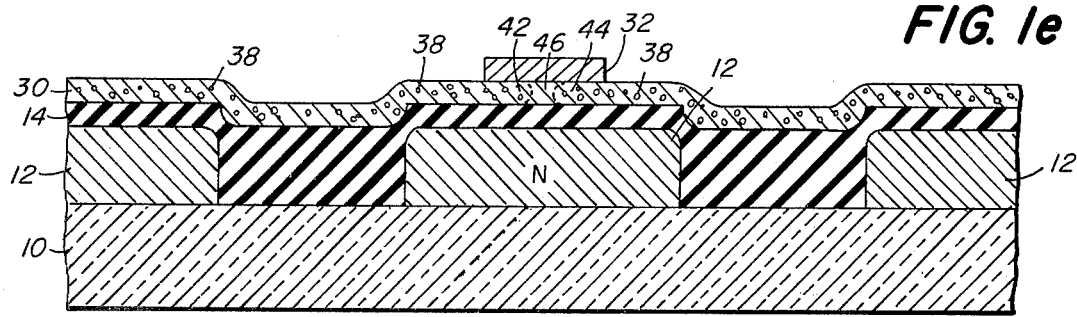

Referring now also to FIG. 1f, the photoresist layer 36 is removed, using any conventional solution. Then the structure is heated for about two hours at a temperature in the range of 1000° C.–1100° C. to diffuse the boron atoms 38 under the silicon nitride layer 32. That is, the heating process causes the boron atoms 38 in the masking layer 30 to diffuse under the nitride layer 32 so that regions 42, 44 having boron ion concentrations of at least $7 \times 10^{19}$ atoms/cm$^3$ are separated a predetermined width related to the gate channel length of the transistor. The minimum separation between the regions 42, 44 is here 1 μm. It is noted that the diffusion process drives the boron ions into the polycrystalline silicon layer 32 so that the edges of the regions 42, 44 (indicated by dotted lines, not numbered) are equidistant from the sides of the layer 32. It is also noted that the region 46 of the layer 30 has a boron ion concentration less than $7 \times 10^{19}$ atoms/cm$^3$ and that the width of such region 46 is here 1 μm. The width is established by the time duration and temperature of the heating (i.e. diffusion) process. Such process is a well-controlled process, and the diffusion of boron atoms in the polycrystalline silicon layer 30 thereby accurately controls the extent to which such boron atoms diffuse into such layer 30.

Figure 1G:
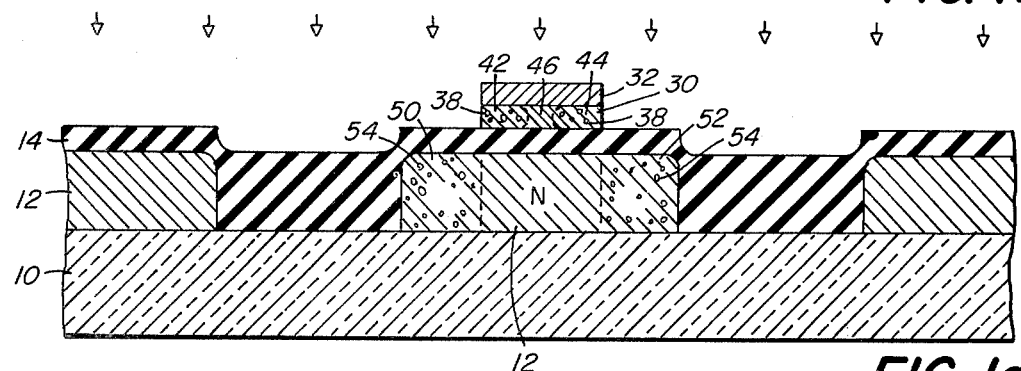

Referring now to FIG. 1g, the surface of the structure is then brought in contact with a suitable chemical etchant, here HNO$_3$:HF:H$_2$O, to remove the portions of the masking layer 30 exposed by the silicon nitride layer 32, as shown. The structure is placed in an ion implantation apparatus to implant phosphorous atoms into the epitaxial layer 12 to form the N+ type source and drain regions 50, 52 for the transistor. The silicon nitride layer 32 and masking layer 30 provide a masking layer 30 provide a mask for the ion implantation process. The ion implantation of the phosphorous atoms 54 is illustrated in FIG. 1g by arrows, not numbered. The concentration of phosphorous atoms in the regions 50, 52 of epitaxial layer 12 is here $10^{20}$ atoms/cm$^3$. It is noted that the region 46 in the masking layer 30 is symmetrically disposed with respect to the source and drain regions 50, 52 because the silicon nitride layer 32 served as the mask for the implantation of the boron atoms, the diffusion of such boron atoms under such layer 32 was symmetrical so that the region 46 is formed in the center of the layer 30, and such layer 32 was used for the mask in ion implanting the phosphorous atoms into the epitaxial layer 12 to form the source and drain regions 50, 52.

Figure 1H:
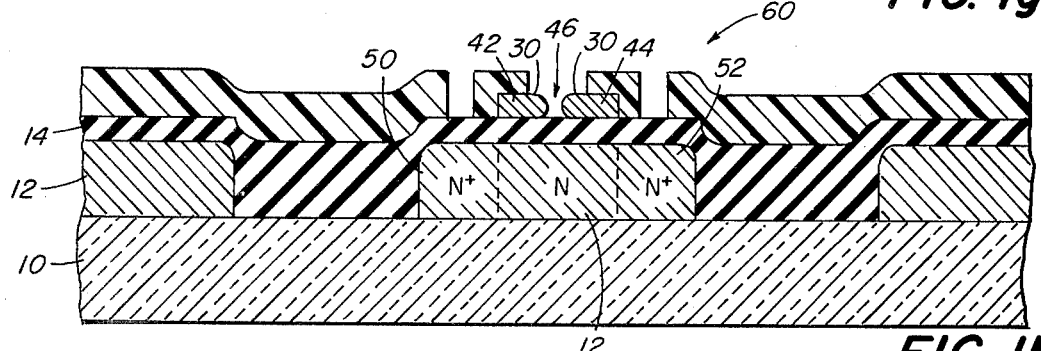

Referring now to FIG. 1h, the silicon nitride layer 32 is removed using a suitable chemical etchant (here hot phosphoric acid). The structure is then immersed in a solution, here of potassium hydroxide-1 propanol and water, to selectively remove only those portions of the polycrystalline silicon layer 30 having a boron atom concentration of less than $7 \times 10^{19}$ atoms/cm$^3$. Alternatively, a solution of ethylene diamine, pyrocatechol and water, may be used. As shown, the region 46 is removed by the chemical etchant and the regions 42, 44 of the layer 30 remain. The width of the region 46 is determined by the diffusion profile of boron atoms after the diffusion process and therefore such width is affected by the initial implant profile. Therefore, the diffusion profile established by the boron atoms in the polycrystalline silicon layer 30 establishes the width of the aperture formed in such layer 30 by the selective etching process. It is noted, therefore, that the aperture formed by the removal of region 46 is disposed symmetrically with respect to the source and drain regions 50, 52 and has a width less than 1 μm. Next, a photoresist contact mask 60 is formed over the structure using conventional photolithography.

Figure 1I:
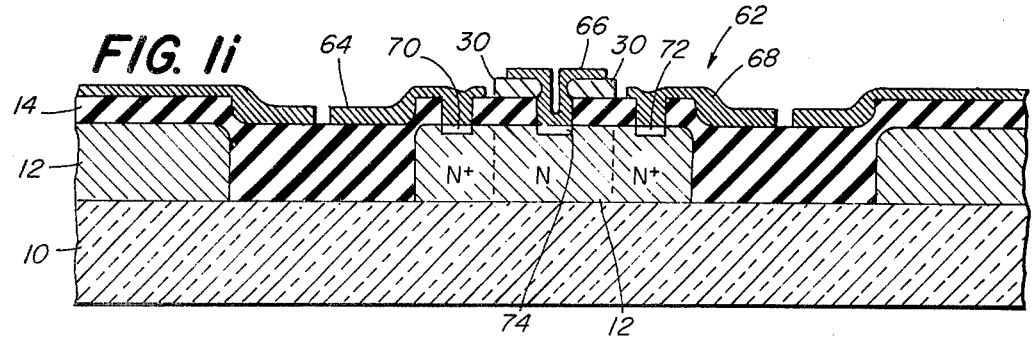

The portions of the silicon dioxide layer 14 exposed by apertures in mask 60 are brought in contact with a suitable etchant, here hydrofluoric acid (HF), to etch apertures in such silicon dioxide layer 14 as shown in FIG. 1i. It is noted that the layer 30 provides a mask for the etching of the silicon dioxide layer 14 and, therefore, the width of the apertures formed in such layer 14 is in the order of 1 μm. The photoresist mask 60 is then removed and a metallization layer 62, here aluminum, is formed over the silicon dioxide layer 14 and through the aperture therein onto the exposed portions of the epitaxial layer 14. The metallization layer 62 is then masked and such layer 62 suitably processed in a conventional manner to form drain, gate and source electrodes 64, 66, 68, respectively, as shown. Ohmic drain, ohmic source and Schottky gate contacts 70, 72, 74, respectively, are formed between the aluminum-silicon (epitaxial layer) interface in a conventional manner as shown in FIG. 1i and FIG. 1j.

Figure 2A:
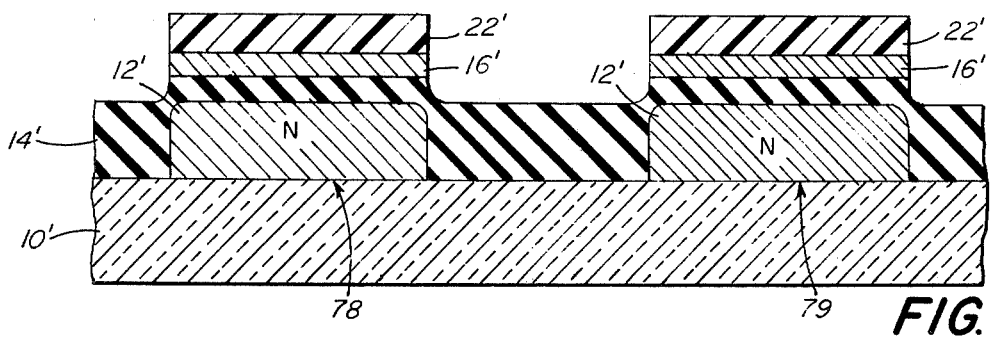
FIGS. 2a-2h are cross-sectional elevational views, somewhat distorted, of a pair of field effect devices at various steps in the manufacture thereof.

Referring now to FIGS. 2a–2h, the steps used in forming an N channel depletion mode MESFET and a P channel enhancement mode metal oxide silicon field effect transistor (MOSFET) concurrently on a common substrate are shown. As indicated in FIG. 2a, a sapphire ($Al_2O_3$) insulating substrate 10' has an epitaxial semiconductor layer 12', here of N type conductivity silicon formed on the surface of the substrate 10'. The epitaxial layer 12' is here formed on a plane parallel to a $<1\bar{1}02>$ crystallographic plane of the substrate 10' and the surface of the semiconductor layer 12' is parallel to a $<100>$ crystallographic plane of the semiconductor layer 12'. The epitaxial semiconductor layer 12' has a thickness here of 0.75 microns and an N type conductivity concentration in the order of $10^{15}$ atoms/cm$^3$. The surface of the epitaxial layer 12' is oxidized in a conventional manner to form an insulating layer 14' of silicon dioxide on such surface, here having a thickness of 1000 Å. Next a layer 16 of silicon nitride ($Si_3N_4$) is formed, here by chemical vapor deposition, on the surface of insulating layer 14'. Here the thickness of the silicon nitride layer 16' is in the order of 1000 Å. A mask of photoresist 22' is formed on the surface of the structure using conventional photolithography to form apertures in the mask where isolation regions are to be formed about the two transistors as described above in connection with FIG. 1a. That is, two isolated regions 78, 79 are formed in the epitaxial semiconductor layer 12'.

That is, the silicon nitride layer 16' exposed by the apertures is brought in contact with a suitable etchant, here plasma etching, to remove such exposed portions, the photoresist layer 22' is removed, the thin exposed portions of the insulating layer 14' are etched away by bringing such exposed portions in contact with a suitable etchant, here hydrofloric acid (HF), then an anisotropic etchant is brought in contact with the then exposed portions of the epitaxial layer 12' to form grooves having walls parallel to the $<111>$ crystallographic planes of the epitaxial layer 12' and finally the structure thus formed is placed in an oxidizing environment to oxidize the side walls and bottom walls of the grooves producing the structure shown in FIG. 2a in a similar manner to that described in connection with FIGS. 1b and 1c.

Figure 2B:
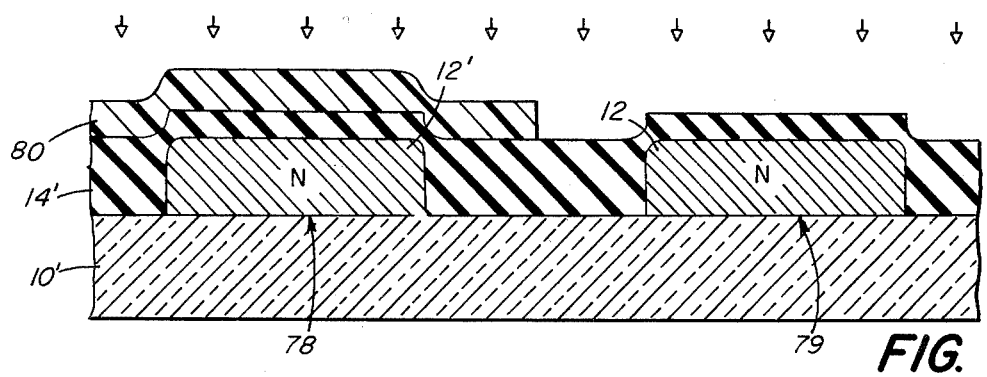

Referring now also to FIG. 2b, the silicon nitride layer 16' is removed, here by plasma etching in a conventional manner, and a layer 80 of photoresist is deposited over the surface of the structure. The portion of the layer 80 disposed over the region 79 is removed, as shown, using conventional photolithography. The surface of the structure, partially covered by the photoresist layer 80, is exposed to phosphorous ions using suitable ion implanting apparatus (not shown). The ion implant is illustrated by arrows, not numbered. The thickness of the photoresist layer 80 covering region 78 prevents such ions from penetrating, substantially, into the portion of the epitaxial layer 12' in the region 78; however, such ions penetrate into the uncovered portion of epitaxial layer 12'; i.e. into the portion of the epitaxial layer 12' in the region 79 to enable the N type conductivity of the epitaxial layer 12' in such region 79 to increase from $10^{15}$ atoms/cm$^3$ to $10^{16}$ atoms/cm$^3$. The photoresist layer 80 is then removed using any conventional process. The surface of the structure is brought in contact with a suitable chemical etchant, here buffered hydrofloric acid ($NH_4F$:HF) to remove 1000 Å of the insulating layer 14'. That is, the portions of the insulating layer 14' which are on the surface of the epitaxial layer 12' are removed. The surface of the structure is then oxidized to form a gate oxide layer 14'' on the surface of the epitaxial layer 12'. Here such gate oxide layer 14'' is 1000 Å thick formed in a conventional manner by oxidizing the surface of epitaxial layer 14' in an atmosphere of a mixture of oxygen and hydrogen chloride (HCl).

Figure 2C:
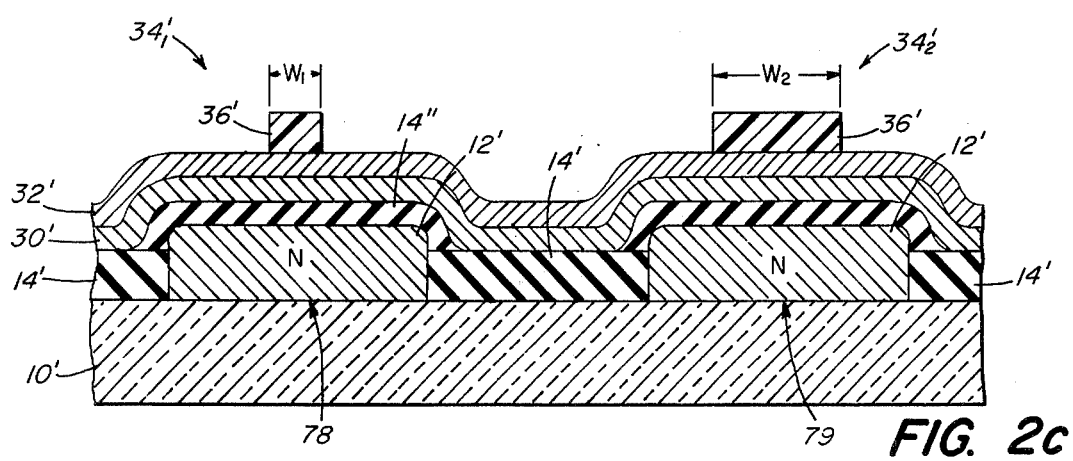

Referring now also to FIG. 2c a layer 30' of polycrystalline silicon, here having a thickness of 3000 Å, is deposited over the surface of the structure as shown in FIG. 2c, using here a chemical vapor deposition. Then a layer 32' of silicon nitride, here having a thickness of 1000 Å, is deposited on polycrystalline silicon layer 32'. A layer 36' of photoresist material is then formed over the surface of the structure and portions thereof are suitably removed, using conventional photolithography, to form a pair of masks $34_1'$, $34_2'$. Mask $34_1'$ has a width, $W_1$, of here 3 μm and mask $34_2'$ has a width, $W_2$, of here 5 μm. The mask $34_1'$ is formed over the relatively central portion of the region 78, as shown, and the mask $34_2'$ is formed over the relatively central portion of the region 79, as shown, using conventional photolithography.

Figure 2D:
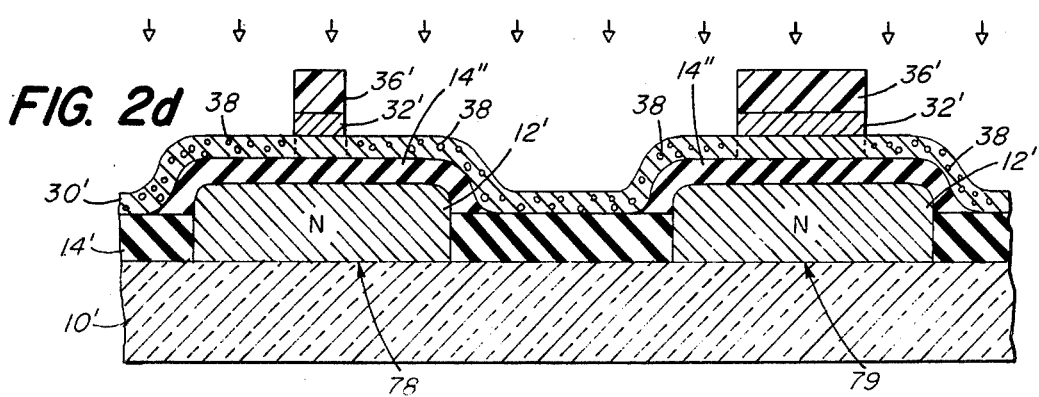

Referring now also to FIG. 2d, the portions of the silicon nitride layer 32' exposed by masks $34_1'$, $34_2'$ are brought in contact with a suitable etchant, here plasma etching, to remove such exposed portions, as shown. The surface of the structure is then exposed to boron ions using suitable ion implanting apparatus, not shown. The ion implant is illustrated in FIG. 2d by arrows, not numbered. The masks $34_1'$, $34_2'$ and the remaining portions of the silicon nitride layer 32' serve as ion implantation masks so that the boron ions become implanted into the polycrystalline silicon or masking layer 30', as shown. The energy level of the ion implanting apparatus is here in the order of 100 KeV and the dose is in the order of $3 \times 10^{15}$ atoms/cm$^2$ so that the minimum carrier density of the boron atoms 38' in the exposed portions of the masking layer 30' is greater than $7 \times 10^{19}$ atoms/cm$^3$. It is noted that two P type conductivity regions are thus formed in the polycrystalline silicon layer 30', the P type conductivity regions in region 79 being separated from each other a width, $W_2$, here 5 μm, and the P type conductivity regions in region 78 being separated from each other a width, $W_1$, here 3 μm, by processes equivalent to that described in connection with FIGS. 1d and 1e above.

Figure 2E:
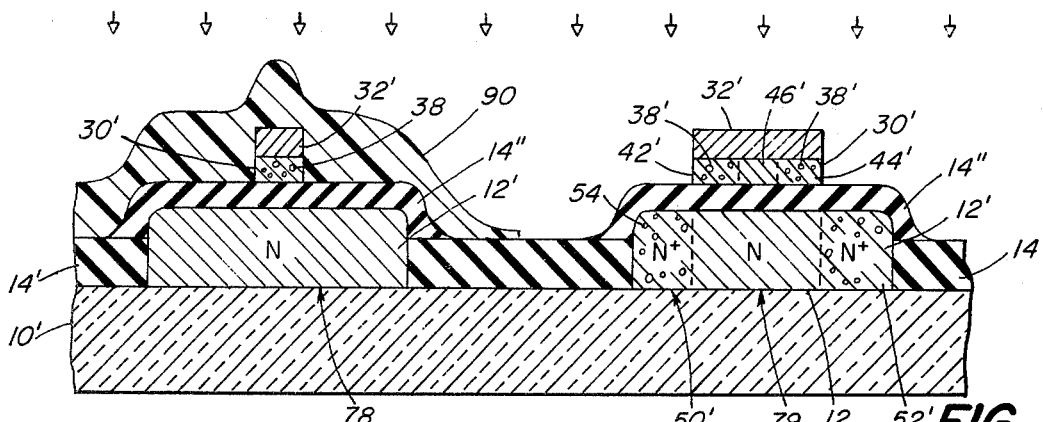
Figure 2F:
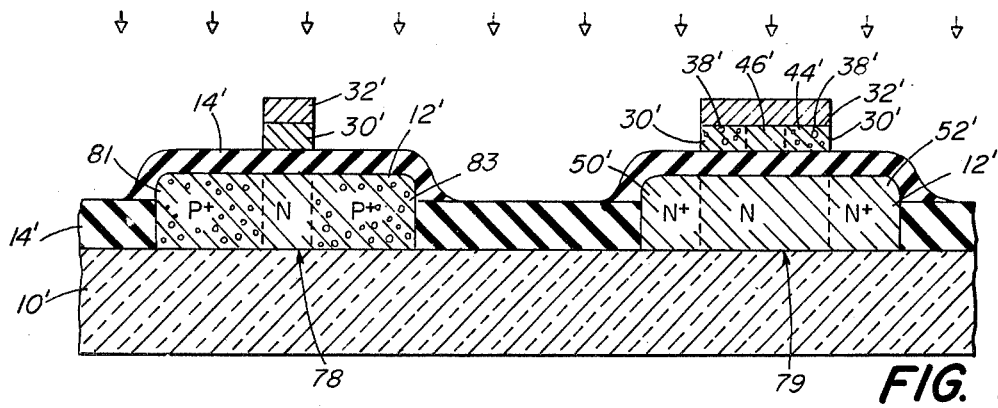

Referring now also to FIG. 2e, the photoresist masks $34_1'$ and $34_2'$ are removed using any conventional process. The structure is then heated for about two hours at a temperature of 1000° C.–1100° C. to diffuse the boron atoms 38' under the silicon nitride layer 32' in the masking layer 30', as shown. That is, the heating process causes the boron atoms 38' in the masking layer 30' to diffuse completely under the portion of the nitride layer 32' which covers region 78 and diffuse partially under the portion of the nitride layer 32' which covers region 79. That is, the heating process causes the boron atoms 38' in the masking layer 30' to diffuse into such layer 30' so that regions 42', 44' have boron atom concentrations of at least $7 \times 10^{19}$ atoms/cm$^3$ and such regions are separated from each other a predetermined width related to the gate channel length of the transistor being formed in region 79. The minimum separation between such regions 42', 44' is here 1 μm. That is, the boron atoms are diffused in the order of 2 μm, laterally, into the masking layer 30' from each side. Therefore, it follows that the boron atoms are diffused to produce a $7 \times 10^{19}$ atoms/cm$^3$ concentration in the entire portion of the masking layer 30' which is disposed over region 78 while regions 42', 44' with such concentration are separated by 1 μm separation (i.e. region 46') formed centrally with respect to the portion of the masking layer 30' which is disposed over the region 79. As discussed in connection with FIG. 1f above, the diffusion process drives the boron atoms into the polycrystalline silicon layer 32' so that the edges of regions 42', 44' (indicated by the dotted lines, not numbered) are equidistant from the sides of the portion of layer 32' which is disposed over region 79, as shown. It is also noted that the region 46' of the layer 30 has a boron atom concentration less than $7 \times 10^{19}$ atoms/cm$^3$ and that the width of such region 46' is here 1 μm. As discussed above in connection with FIG. 1f, the width is established by the time duration and temperature of the heating (i.e. diffusion) process. Such process is a well controlled process and the diffusion of boron in the polycrystalline silicon layer 30' thereby accurately controls the extent to which the boron diffuses into the layer 30'.

The surface of the structure is then brought in contact with a suitable chemical etchant, here HNO$_3$:HF:H$_2$O to remove the portions of the masking layer 30' which are exposed by the silicon nitride layer 32', as shown, in a manner similar to that described in connection with FIG. 1g. Photoresist material is then deposited over the surface of the structure and selectively removed, using conventional photolithography, to form a mask 90 over the region 78, as shown. The structure is placed in a conventional ion implanting apparatus to implant phosphorous ions into the portions of region 79 of epitaxial layer 12' which is exposed by the remaining portions of the silicon nitride layer 32' and polycrystalline silicon layer 30'. The ion implantation of phosphorous ions is illustrated by arrows, not numbered, in FIG. 2e. The silicon nitride layer 32' and masking layer 30' provide a mask for the ion implantation process to enable the formation of N+ type conductivity source and drain regions, 52', 50' of the transistor being formed in the region 79 of epitaxial layer 12' in a manner similar to that described in connection with FIG. 1g. Here, however, the concentration of phosphorous atoms in regions 52', 50' of epitaxial layer 12' is $10^{21}$ atoms/cm$^3$. It is again noted that the region 46' in the masking layer 30' is symmetrically disposed with respect to the source and drain regions 52', 50' because: The silicon nitride layer 32' served as the mask for the implantation of the boron atoms; the diffusion of such boron atoms under the layer 32' was symmetrical so that the region 46' is formed in the center of such layer 32'; and such layer 32' was used for the mask in ion implanting the phosphorous atoms into the portion 79 of the epitaxial layer 12' to form the source and drain regions 52', 50' in such layer 12'. The photoresist mask is then stripped away using any conventional process. The structure is then placed in a conventional ion implanting apparatus to implant boron ions into the surface of such structure. It is first noted that the layers 30', 32' provide masks for such boron implantation. Therefore, the boron atoms become implanted into regions 81, 83 to form P+ type conductivity regions in the region 78 of epitaxial layer 12' and in the N+ type conductivity regions 50', 52' of region 79 of epitaxial layer 12'. The P+ type concentration formed in the P+ regions 81, 83 is $10^{20}$ atoms/cm$^3$ and hence is an order of magnitude less than the $10^{21}$ atoms/cm$^3$ concentration in the N+ type conductivity regions 50', 52'. Therefore, the implanted boron ions do not counter the N+ type conductivity in regions 50', 52'. Alternatively, a photoresist mask may be formed over the region 79 in FIG. 2f, using conventional photolithography, prior to the implantation process to prevent any significant implantation in the region 79. (Such mask would then be removed in a conventional manner after the implantation process.)

Figure 2G:
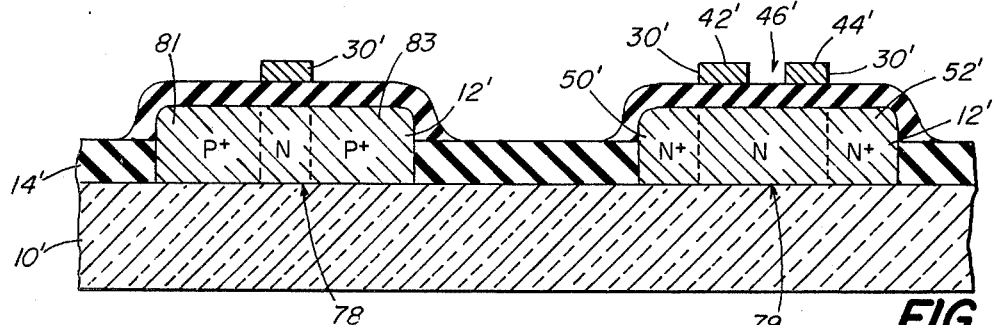

Referring now also to FIG. 2g, the silicon nitride layer 32' is removed, using a suitable chemical etchant, here hot phosphoric acid. The structure is then immersed in a solution of potassium hydroxide, 1-propanol and water to selectively remove only those portions of the polycrystalline silicon or masking layer 30' having a boron ion concentration of less than $7 \times 10^{19}$ atoms/cm$^3$. Alternatively, a solution of ethylene diamine, pyrocatechol and water may be used. As shown, the region 46' is removed by the chemical etchant and the regions 42', 44' of the layer 30' remain together with the portion of such layer 30' which is disposed over the region 79. The width of the region 46' is determined by the diffusion profile of the boron atoms after the diffusion process as described in connection with FIG. 1h. Next, a photoresist contact mask (not shown) is formed over the surface of the structure using conventional photolithography.

Figure 2H:
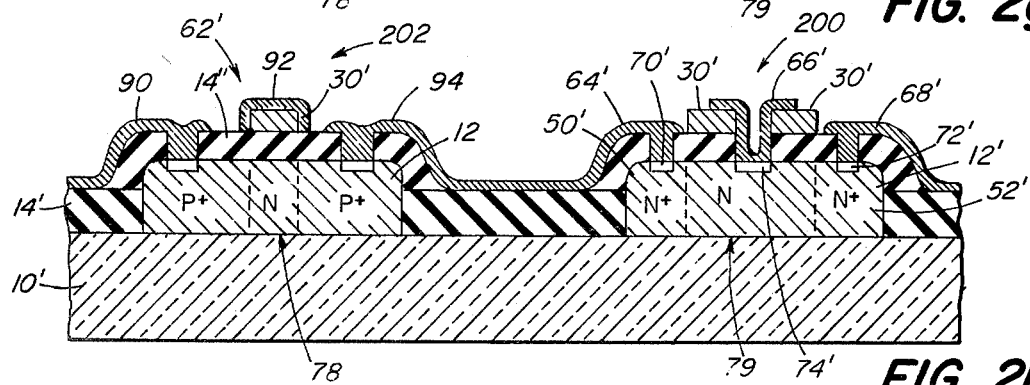

The portions of the silicon dioxide layer 14' exposed by apertures in such mask are brought in contact with a suitable etchant, here hydrofloric acid (HF), to etch apertures in such silicon dioxide layer 14' as shown in FIG. 2h. It is noted that the masking layer 30' provides a mask for the etching of the silicon dioxide layer 14' and, therefore, the width of the aperture formed in layer 14' is in the order of 1 μm for reasons discussed above in connection with FIGS. 1g–1i. The photoresist mask is then removed and a metallization layer 62', here aluminum, is formed over the silicon dioxide layer 14' and through the apertures therein onto the exposed portions of the epitaxial layer 12'. The metallization layer 62' is then masked and suitably processed in a conventional manner to form drain, gate and source electrodes 64', 66', 68', respectively, as shown for the N channel depletion mode MESFET 200 formed in region 79 of the epitaxial layer 12' and drain and source electrodes 90, 94, respectively, as shown, for the P channel enhancement mode MOSFET 202 formed in region 78 of epitaxial layer 12', as shown. A gate contact 92 is also formed by the aluminum, as shown. Ohmic drain, ohmic source and Schottky gate contacts 70', 72' and 74', respectively, are formed in a conventional manner between the aluminum-silicon interfaces. Ohmic source and ohmic drain contacts for MOSFET 202 are formed in a conventional manner between the aluminum-silicon interfaces. It is noted that here the source electrode of MOSFET 202 is connected to the drain electrode of MESFET 200 for reasons to be discussed in connection with FIG. 4. However, such devices need not be so connected in the more general case.

Referring now to FIG. 3, logic gate 204 according to the prior art is shown. Such logic gate 204 includes a plurality of MESFET devices $Q_1$, $Q_2$, $Q_3$, $Q_4$, $Q_5$ and Schottky diodes $D_1$, $D_2$, $D_3$ arranged as shown and formed on a gallium arsenide (GaAs) substrate. Transistors $Q_1$, $Q_2$ have source electrodes connected to ground and drain electrodes coupled to a $+V_{DD}$ supply through a depletion load transistor $Q_3$. The gate electrodes of transistors $Q_1$, $Q_2$ are connected to logical signal sources A, B, respectively, as indicated. The drain electrode of transistor $Q_3$ is connected to the $+V_{DD}$ supply, and the source electrode is connected to the gate electrode of such transistor and to the gate electrode of transistor $Q_4$, as shown. The drain electrode of transistor $Q_4$ is connected to the $+V_{DD}$ supply and the source electrode is connected to a $-V_{SS}$ supply through serially connected diodes $D_1$, $D_2$, $D_3$ and transistor $Q_5$, as shown. Transistor $Q_5$ acts as a current source such that the diodes $D_1$, $D_2$ and $D_3$ act to shift the output voltage at the source of the $Q_4$ source follower negatively by three diode voltage drops. The transistors $Q_1$, $Q_2$ serve as inverters. In operation, if A (or B) is "high", transistor $Q_1$ (or $Q_2$) goes "on", pulling the source electrode of transistor $Q_3$ to ground. Transistor $Q_4$ is a depletion mode device and, as noted above, serves as a source follower; therefore, the source electrode of the transistor $Q_4$ will be one threshold voltage, here 1 volt, more positive than ground potential. That is, if $V_{DD}$ is here $+4$ volts and $V_{SS}$ is $-3$ volts, then the drain electrode of transistor $Q_5$ will be (assuming each one of the diodes $D_1$, $D_2$, $D_3$ provides a 0.7 volt drop) 1 volt $-(3)(0.7)$ volts $= -1.1$ volt (i.e., a "low" or logic "0" signal). Conversely, if the logic signals A and B are both "low," transistor $Q_1$ and transistor $Q_2$ have no current flow through them and the drain electrodes of transistors $Q_1$ and $Q_2$ go to $+V_{DD}$. This causes the source electrode of transistor $Q_4$ to go to $(+V_{DD}-(3)(0.7)$ volts$)=1.9$ volts, a "high" or logic "1" signal. (However, such voltage will be clamped to the Schottky diode voltage of another logic gate similar to gate 204 (not shown) which is driven by logic gate 204. Here the Schottky diode voltage is $+.7$ volts which is still a "high" or logic "1" signal). Therefore, the logic gate 204 provides the logic function $\overline{(A+B)}$.

While such logic gate 204 may be adequate in some applications, it generally requires relatively large amounts of current to flow through transistors $Q_4$, $Q_5$ and diodes $D_1$, $D_2$, $D_3$ in order for the gate to provide rapid switching, particularly where such gate 204 is used to drive high capacitance loads due to long interconnects or large fan output. Such requirement, however, results in such logic gate 204 requiring relatively large amounts of power.

Referring now to FIG. 4, a logic gate 206 is shown to include a pair of N channel depletion mode MESFET's 210, 212, arranged as source followers, serially connected Schottky diodes $D_A$, $D_B$, $D_C$, a P channel enhancement mode MOSFET 202 and an N channel depletion mode MESFET 200 arranged as inverters as shown and formed on a single crystal substrate. Here sapphire substrate 10' is used and the MOSFET 202 and MESFET 200 are here formed by the process described above in connection with FIGS. 2a-2h. As shown, the drain electrodes of transistors 210, 212 are connected to a $+V_{DD}$ supply and the gate electrodes of such transistors are connected to logic signal sources A, B, respectively, as indicated. The source electrodes of transistors 210, 212 are connected to a $V_{SS}$ supply through the serially connected Schottky diodes $D_A$, $D_B$, $D_C$ and transistor 214, as shown, and the gate electrode of MOSFET 202, as shown. Transistor 214 acts as a current source and diodes $D_A$, $D_B$, $D_C$ act as voltage level shifters in the manner described above for the prior art gate 204. The drain electrode of MOSFET 202 is connected to the $+V_{DD}$ supply as shown and the source electrode of MOSFET 202 is connected to the drain electrode of MESFET 200 as shown in FIG. 4 (and FIG. 2h). The source electrode of MOSFET 202 is connected to output conductor 216. The source electrode of MESFET 200 is connected to ground. The gate electrode of MESFET 200 is connected to diode D and the drain electrode of transistor 214, as shown. The source electrode of transistor 214 is connected to the $-V_{SS}$ supply and the gate electrode of such transistor, as shown.

In operation, transistors 210, 212 serve, as mentioned above, as source followers and therefore because their source electrodes are tied together the output voltages produced on such source electrodes represent the "AND" logical operation of the logic signals A, B (i.e. A·B). The diodes $D_A$, $D_B$, $D_C$ serve as offset diodes because they translate the output levels of transistors 210, 212, negatively, to compensate for the depletion type threshold voltages of transistors 200, 210 and 212. Transistor 214 serves as a current source for the level shifting diodes $D_A$, $D_B$, $D_C$ and insures that such diodes remain forward-biased at all times. MESFET 200 serves as an inverter with MOSFET 202 serving as a "pull up" device. Because MOSFET 202 is P channel enhancement mode device, it also operates as an inverter.

In operation, if both logic signals (A and B) are "high" the source electrodes of transistors 210 and 212 go to $+V_{DD}$. (Here $+V_{DD}$ is $+4$ volts and $-V_{SS}$ is $-3$ volts). Diodes $D_A$, $D_B$, $D_C$ try to translate this voltage to $+1.9$ volts because each one of the diodes $D_A$, $D_B$, $D_C$ provides 0.7 volt drop (i.e. $V_{DD}-(3)(0.7)$ volts $= +1.9$ volts). However, at 0.7 volt the Schottky diode of transistor 200 will forward conduct clamping the input of transistor 200 at 0.7 volt. The MESFET 200 goes "on" and the drain electrode therefore goes to ground potential so that the output on line 216 is "low" or at logic "0" level. It is noted that MOSFET 202 is "off" because the gate electrode of such MOSFET 202 is at, or near, $+V_{DD}$. Alternatively, if logical A and B are low (i.e., near ground potential), the source electrodes of transistors 210, 212 will go to $+1$ volt more positive than the "low" logic signal A or B because such transistors 210, 212 are depletion mode source followers. This $+1$ volt level becomes translated by the diodes $D_A$, $D_B$, $D_C$ to $-1.1$ volts (i.e., $+1$ volt $-(3)(0.7)$ volts$= -1.1$ volts) and therefore MESFET 200 turns "off." MOSFET 202 turns "on" because of the $+1$ volt level on its gate electrode and therefore output line 216 goes to $+V_{DD}$ volts to produce a "high" or logic "1" signal. Therefore, the logic gate 206 provides the logic function $\overline{AB}$.

It is noted that the serially connected diode circuits $D_A$, $D_B$, $D_C$ and 214 can now be a high impedance circuit because such circuit does not drive the load (i.e., other logic gates and interconnects, not shown) connected to output line 216. Such connected logic gate (or gates), not shown, are driven in complementary fashion by the MOSFET 202 and MESFET 200 and, hence, the power required by gate 206 is significantly lower than that required for gate 204 (FIG. 3) for the same switching speed performance under systems operating conditions.

Having described a preferred embodiment of this invention, it is evident that other embodiments incorporating its concepts may be used. It is felt, therefore, that this invention should not be restricted to the preferred embodiment, but rather should be limited only by the spirit and scope of the appended claims.

What is claimed is:
1. A logic gate comprising:
  (a) a first depletion mode field effect transistor having a gate electrode for coupling to a control signal source;
  (b) a second depletion mode transistor;
  (c) an enhancement mode field effect transistor, such enhancement mode field effect transistor and sec- ond depletion mode transistor being serially connected together and being coupled to the first depletion mode transistor, one of such serially coupled transistors having a Schottky gate contact; and (d) bias means coupled to the first and second depletion mode transistors for biasing the second depletion mode transistor and the enhancement mode field effect transistor with opposite states of conduction selectively in accordance with the control signal.

2. The logic gate recited in claim 1 wherein the second depletion mode transistor is a MESFET.

3. The logic gate recited in claim 2 wherein the enhancement mode transistor is a MOSFET.

4. The logic gate recited in claim 3 wherein one of such serially connected transistors is an N channel transistor and the other one of such serially connected transistors is a P channel transistor.

5. The logic gate recited in claim 4 wherein the MOSFET is a P channel transistor and the MESFET is an N channel transistor.

6. The logic gate recited in claim 5 including means for coupling the drain electrode of the MOSFET to a first electriccal potential, the source relectrode to the drain electrode of the MESFET and the source electrode of the MESFET to a second electrical potential.

7. The logic gate recited in claim 6 wherein the first depletion mode transistor is a MESFET having its drain electrode for coupling to the first electrical potential and its source electrode connected to the gate electrode of the MOSFET.

8. The logic gate recited in claim 7 wherein the bias means includes a diode network connected between the source electrodde of the first depletion mode transistor and the gate electrode of the serially connected MESFET.

9. A logic gate comprising:

(a) a depletion mode field effect transistor;

(b) an enhancement mode field effect transistor serially connected to the depletion mode transistor, one of such transistors having a Schottky gate contact; and (c) means, responsive to a control signal, for driving the depletion mode transistor to an "on" condition and the enhancement mode transistor to an "off" condition, or, alternatively, driving the depletion mode transistor to an "off" condition and the enhancement mode transistor to an "on" condition selectively in accordance with the control signal.

10. A logic gate comprising:

(a) a first depletion mode field effect transistor having a gate electrode for coupling to a control signal;

(b) a second depletion mode field effect transistor having a gate electrode coupled to the first depletion mode field effect transistor;

(c) an enhancement mode field effect transistor serially connected with the second depletion mode field effect transistor; and, (d) a diode network connected to the gate electrode of the second depletion mode field effect transistor and to the gate electrode of the enhancement mode field effect transistor.

11. A logic gate comprising:

(a) a depletion mode field effect transistor;

(b) an enhancement mode field effect transistor serially connected to the depletion mode transistor; and (c) means, responsive to a control signal, for driving the depletion mode transistor to an "on" condition and the enhancement mode transistor to an "off" condition, or, alternatively, driving the depletion mode transistor to an "off" condition and the enhancement mode transistor to an "on" condition selectively in accordance with the control signal.

* * * * *